United States Patent
Nishida

(10) Patent No.: US 9,218,968 B2
(45) Date of Patent: Dec. 22, 2015

(54) METHOD FOR FORMING CRYSTALLINE THIN-FILM AND METHOD FOR MANUFACTURING THIN FILM TRANSISTOR

(75) Inventor: Kenichirou Nishida, Hyogo (JP)

(73) Assignee: JOLED INC, Tokyo (JP)

(*) Notice: Subject to any disclaimer, the term of this patent is extended or adjusted under 35 U.S.C. 154(b) by 0 days.

(21) Appl. No.: 14/352,136

(22) PCT Filed: Nov. 29, 2011

(86) PCT No.: PCT/JP2011/006667
§ 371 (c)(1),
(2), (4) Date: Apr. 16, 2014

(87) PCT Pub. No.: WO2013/080252
PCT Pub. Date: Jun. 6, 2013

(65) Prior Publication Data
US 2014/0308804 A1 Oct. 16, 2014

(51) Int. Cl.
*H01L 21/20* (2006.01)
*H01L 21/02* (2006.01)
*H01L 21/268* (2006.01)
*H01L 29/66* (2006.01)
*H01L 29/04* (2006.01)
*H01L 27/12* (2006.01)

(52) U.S. Cl.
CPC .... *H01L 21/02683* (2013.01); *H01L 21/02422* (2013.01); *H01L 21/02532* (2013.01); *H01L 21/02592* (2013.01); *H01L 21/02595* (2013.01); *H01L 21/02691* (2013.01); *H01L 21/268* (2013.01); *H01L 27/1285* (2013.01); *H01L 29/04* (2013.01); *H01L 29/66757* (2013.01); *H01L 29/66765* (2013.01)

(58) Field of Classification Search
CPC ............... H01L 21/02691; H01L 21/02675
USPC .................................................. 438/487
See application file for complete search history.

(56) References Cited

U.S. PATENT DOCUMENTS

| 5,907,770 | A | 5/1999 | Yamazaki et al. |
| 6,461,899 | B1* | 10/2002 | Kitakado et al. ............ 438/149 |
| 6,902,616 | B1 | 6/2005 | Yamazaki et al. |

(Continued)

FOREIGN PATENT DOCUMENTS

| JP | 06-172926 | 6/1994 |
| JP | 09-106948 | 4/1997 |

(Continued)

OTHER PUBLICATIONS

International Search Report for PCT/JP2011/006667, which was mailed on Mar. 6, 2012.

*Primary Examiner* — Caridad Everhart
(74) *Attorney, Agent, or Firm* — Greenblum & Bernstein, P.L.C.

(57) ABSTRACT

A method for forming the crystalline thin film according to an implementation of the present invention includes: preparing a substrate; forming a non-crystalline thin film above the substrate; and crystallizing at least a predetermined region in the non-crystalline thin film, by irradiating the non-crystalline thin film with a laser beam having a predetermined wavelength and scanned relative to the substrate. In the preparing, a direction of a largest residual stress on the substrate is identified. In the crystallizing, the laser beam is scanned in the identified direction of the largest residual stress.

9 Claims, 12 Drawing Sheets

(56) References Cited

U.S. PATENT DOCUMENTS

| | | |
|---|---|---|
| 7,232,714 B2 | 6/2007 | Kato et al. |
| 7,513,949 B2 | 4/2009 | Yamazaki et al. |
| 7,538,348 B2 | 5/2009 | Kato et al. |
| 7,547,866 B2 | 6/2009 | Tanaka et al. |
| 7,777,210 B2 | 8/2010 | Tanaka et al. |
| 7,935,968 B2 | 5/2011 | Kato et al. |
| 8,022,380 B2 | 9/2011 | Tanaka et al. |
| 2003/0164522 A1 | 9/2003 | Kato et al. |
| 2004/0065643 A1* | 4/2004 | Tanaka ................ 219/121.8 |
| 2005/0160767 A1* | 7/2005 | Novak ................ 65/29.17 |
| 2005/0214991 A1 | 9/2005 | Yamazaki et al. |
| 2005/0255716 A1 | 11/2005 | Tanaka et al. |
| 2006/0270130 A1* | 11/2006 | Sato et al. ................ 438/166 |
| 2007/0040176 A1 | 2/2007 | Kato et al. |
| 2009/0206345 A1 | 8/2009 | Kato et al. |
| 2009/0250590 A1 | 10/2009 | Tanaka et al. |
| 2009/0278287 A1* | 11/2009 | Wang et al. ................ 264/485 |
| 2010/0304506 A1 | 12/2010 | Tanaka et al. |
| 2012/0241919 A1* | 9/2012 | Mitani ................ 257/623 |

FOREIGN PATENT DOCUMENTS

| | | |
|---|---|---|
| JP | 10-270360 | 10/1998 |
| JP | 2001-276986 | 10/2001 |
| JP | 2003-229580 | 8/2003 |
| JP | 2004-031810 | 1/2004 |
| JP | 2005-340788 | 12/2005 |
| JP | 2010-103485 | 5/2010 |
| JP | 2011-165717 | 8/2011 |

* cited by examiner (Before laser beam emission)

(a)

(After laser beam emission)

(b)

METHOD FOR FORMING CRYSTALLINE THIN-FILM AND METHOD FOR MANUFACTURING THIN FILM TRANSISTOR

TECHNICAL FIELD

The present invention relates to a method for forming a crystalline thin film and a method for manufacturing a thin-film transistor.

BACKGROUND ART

Active matrix display devices, such as organic electroluminescence (EL) display devices or liquid crystal display devices, have a thin-film transistor (TFT) provided to each of pixels arranged in a matrix.

The thin-film transistor includes, above a substrate, a gate electrode, a semiconductor layer (a channel layer) a source electrode, and a drain electrode. The channel layer typically includes a silicon thin film. The silicon thin film is roughly classified into a non-crystalline silicon thin film (an amorphous silicon thin film) and a silicon thin film (a crystalline silicon thin film) processed with a crystallization treatment.

A thin-film transistor including the crystalline silicon thin film as a channel layer presents greater carrier mobility and better on-state current characteristics than a thin-film transistor including the non-crystalline silicon thin film as a channel layer. Thus, the use of the crystalline silicon thin film is beneficial as a channel layer for a driving transistor since excellent on-state current characteristics are required of thin-film transistors (driving transistors) to drive organic EL elements in an organic EL display device.

One of conventional techniques to form such a crystalline silicon thin film involves irradiating, with a laser beam, an amorphous silicon thin film formed above a substrate to crystallize the amorphous silicon thin film (See Patent Literatures 1 and 2).

CITATION LIST

Patent Literature

[PTL 1]
Japanese Unexamined Patent Application Publication No. 2011-165717
[PTL 2]
Japanese Unexamined Patent Application Publication No. 2003-229580

SUMMARY OF INVENTION

Technical Problem

Unfortunately, the use of a laser beam to crystalline a thin film, such as an amorphous silicon film, inevitably increases the temperature of the thin film due to the irradiation with the laser beam, and most of the heat produced at the thin film transmits to the substrate. The heat from the thin film develops a problem of an increase in the temperature of the substrate, followed by its shrinkage and warpage. In the subsequent manufacturing processes of the thin-film transistor, the warped substrate could cause insufficient substrate chuck when the substrate is fixed to a stage of the manufacturing apparatus.

In addition, the inventors of the present invention have found a new problem that the irradiation with the laser beam of the thin film provided above the substrate causes anisotropy in amount of warpage and shrinkage of the substrate. In other words, the warpage and shrinkage of the substrate caused by the irradiation with the laser beam differ between the longitudinal direction and the lateral direction of the substrate. Hence, the anisotropy in amount of warpage and shrinkage of the substrate could hinder a predetermined exposure in the subsequent photolithography process (an exposure process).

The above problems have become obvious in particular to substrates for display panels, because large screens for recent display panels are a cause of a large warpage amount at an end of a substrate.

The present invention is conceived in view of the above problems and aims to provide a method for forming a crystalline thin film and a method for manufacturing a thin-film transistor which can curb an increase in amount of warpage on a substrate.

Solution to Problem

In order to achieve the above aims, a method for forming the crystalline thin film according to an aspect according to the present invention includes: preparing a substrate; forming a thin film above the substrate; and crystallizing at least a predetermined region in the thin film, by irradiating the thin film with a beam having a predetermined wavelength and scanned relative to the substrate, wherein, in the preparing, a direction of a largest residual stress on the substrate is identified, and in the crystallizing, the beam is scanned in the identified direction of the largest residual stress.

Advantageous Effects of Invention

The present invention successfully curbs an increase in amount of warpage of a substrate, and improves anisotropy in amount of warpage and shrinkage of the substrate.

DESCRIPTION OF EMBODIMENT

Figure 1:
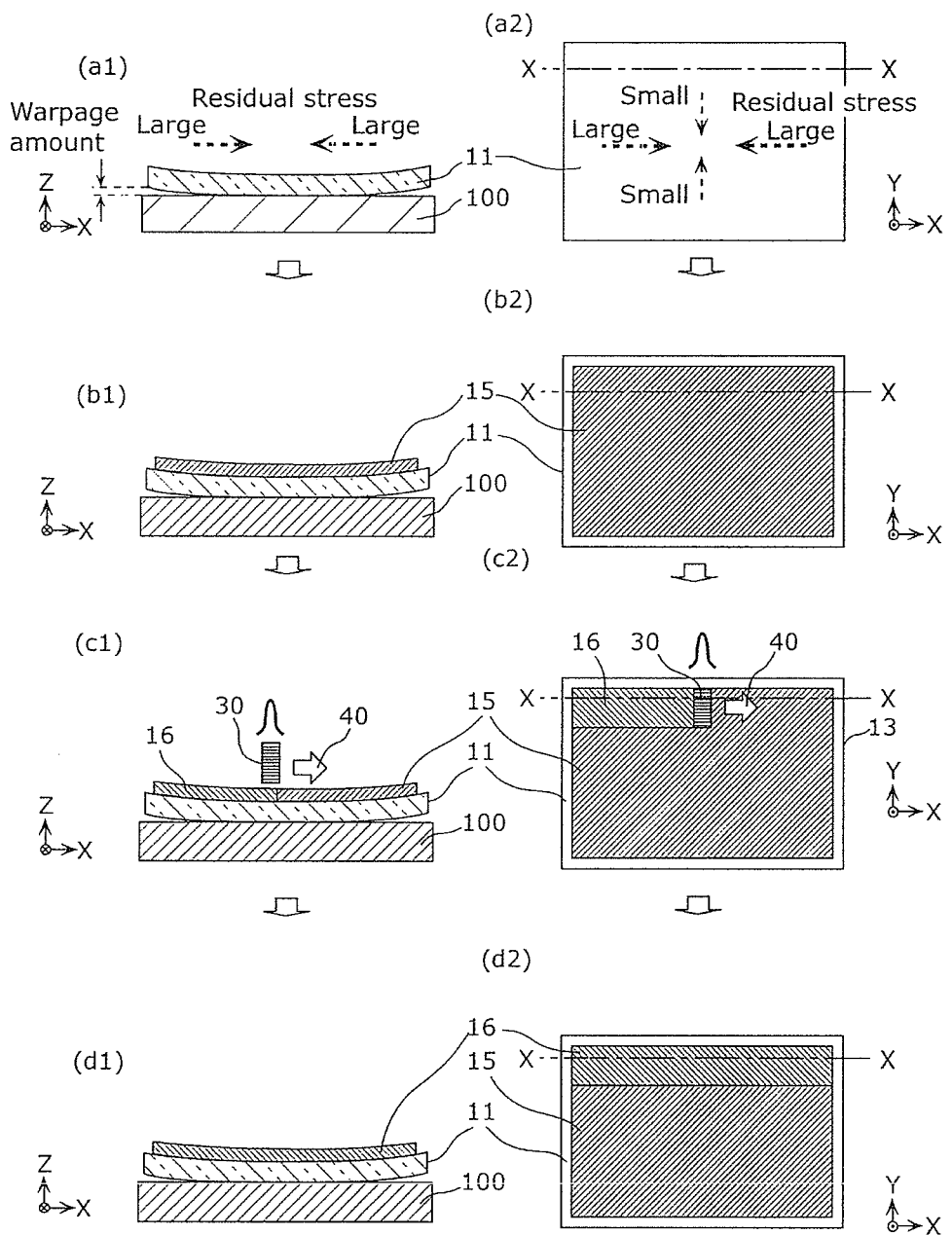
FIG. 1 (a1)-(d2) schematically represents a cross-sectional view and a plan view of each of processes in a method for forming a crystalline thin film according to an embodiment of the present invention.

In order to achieve the above aims, a method for forming the crystalline thin film according to an implementation of the present invention includes: preparing a substrate; forming a thin film above the substrate; and crystallizing at least a predetermined region in the thin film, by irradiating the thin film with a beam having a predetermined wavelength and scanned relative to the substrate, wherein, in the preparing, a direction of a largest residual stress on the substrate is identified, and in the crystallizing, the beam is scanned in the identified direction of the largest residual stress.

The implementation makes it possible to identify the direction of the largest residual stress on the substrate, and then scan the laser beam along the identified direction of the largest residual stress. Such features contribute to curbing an increase in amount of warpage and shrinkage which are caused by the laser beam irradiation and appear on the entire substrate. Hence, the warpage amount of the substrate can be kept within a range in which the substrate can be fixed to a manufacturing apparatus. In the subsequent manufacturing processes, substrate chuck and the like can be appropriately executed.

The temperature gradient caused by the irradiation with the laser beam develops anisotropy in amount of warpage and shrinkage of the substrate. In the implementation, however, the laser beam scans along the identified direction of the largest residual stress, and the anisotropy in amount of warpage and shrinkage of the substrate due to irradiation with the laser beam and the anisotropy in residual stress on the substrate act with each other to cancel the other out. Such a feature allows warpage amounts and shrinkage amounts of the substrate irradiated with the laser beam to be isotropic, which makes it possible in the subsequent photolithography process to facilitate predetermined exposure and prevent pattern misalignment.

In the method for forming the crystalline thin film according to an implementation of the present invention, in the preparing, the identified direction of the maximum residual stress may be a direction in which a measured warpage amount of the substrate is large.

In the method for forming the crystalline thin film according to an implementation of the present invention, the beam is one of a YAG laser beam, a continuously oscillated laser beam, and a beam for heating a lamp.

In the method for forming the crystalline thin film according to an implementation of the present invention, the irradiating includes irradiating a whole surface of the thin film with the beam.

In the method for forming the crystalline thin film according to an implementation of the present invention, the substrate is rectangular, and the direction of the maximum residual stress is a longitudinal direction of the substrate.

In the method for forming the crystalline thin film according to an implementation of the present invention, the substrate is manufactured by thermally processing a precursor of the substrate.

In the method for forming the crystalline thin film according to an implementation of the present invention, the substrate formed by stretching the precursor of the substrate, and the direction of the maximum residual stress is a direction in which the substrate is stretched.

In the method for forming the crystalline thin film according to an implementation of the present invention, the substrate is a glass substrate. In the method for forming the crystalline thin film according to an implementation of the present invention, the substrate is a plastic substrate.

A method for manufacturing the crystalline thin film according to an implementation of the present invention includes forming a channel region of a bottom-gate thin-film transistor, using one of the methods for forming the crystalline thin film according to Hereinafter, a method for forming a crystalline thin film and a method for manufacturing a thin-film transistor according to an exemplary embodiment are described in greater detail with reference to the accompanying Drawings. It is noted that the embodiment below is a specific example of the present invention. The numerical values, shapes, materials, constituent elements, arrangement positions of and connecting schemes between the constituent elements, steps, and an order of steps all described in the embodiment are examples, and shall not be defined as they are. The present invention shall be defined only by claims. Hence, among the constituent elements in the embodiment, those not described in an independent claim representing the most generic concept of the present invention are not necessarily required to achieve the objects of the present invention; however, such constituent elements are introduced to implement a preferable form of the present invention. The same reference numerals that are shared among the illustrations in the drawings show a corresponding part.

[Method for Forming a Crystalline Thin Film]

Described first is a method for forming a crystalline thin film according to an embodiment of the present invention, with reference to FIG. 1. FIG. 1 schematically represents a cross-sectional view and a plan view of each of processes in a method for forming a crystalline thin film according to an embodiment of the present invention. It is noted that, in FIG. 1, the illustrations (a2) to (d2) are plan views, and the illustrations (a1) to (d1) are cross-sectional views along X-X lines in the illustrations (a2) to (d2).

First, as represented in the illustrations (a1) and (a2) in FIG. 1, a substrate 11 is prepared. The substrate 11 is placed on and fixed to a stage (a base) 100 of an apparatus (a substrate preparing process). The substrate 11 may include, for example, a glass substrate including a glass material such as silica glass, or a flexible plastic substrate including a resin material such as transparent resin. When the substrate 11 is placed (substrate chuck), for example, the rear surface of the substrate 11 is sucked to a surface of the base 100 by vacuum chuck. An exemplary substrate 11 includes, but not limited to, a G4.5 substrate (730 mm×920 mm) in terms of a substrate size.

The process for preparing the substrate 11 involves identifying a direction of the largest residual stress among inside residual stresses which remain inside the substrate 11. The direction of the largest residual stress can be identified by, for example, measuring a warpage amount at each of end portions along the horizontal direction (the X-axis direction) and the vertical direction (the Y-axis direction) of the substrate 11. Here, the warpage amount of the substrate 11 is obtained by measuring a distance between the surface of the base to which the substrate 11 is provided and the bottom surface of an end portion of the substrate 11. For example, the illustration (a2) in FIG. 1 represents that warpage amounts are measured at the center points of both the short sides of the rectangular substrate 11 (warpage amounts along the X-axis direction); and other warpage amounts are measured at the center points of both the long sides of the substrate 11 (warpage amounts along the Y-axis direction). Then the larger warpage amount along either the X-axis direction or the Y-axis direction can be identified as the direction of the largest residual stress. The illustration (a2) in FIG. 1 represents that the warpage amounts along the X-axis direction are greater than those along the Y-axis direction, and the direction of the largest residual stress on the substrate 11 is the X-axis direction that—that is, the longitudinal direction of the substrate 11.

It is noted that the process for preparing the substrate 11 may additionally include, for example: a substrate cleaning process for removing an extraneous matter attached to the surface of the glass substrate; a process for etching the surface of the glass substrate for removing alkali metal components on the surface of the glass substrate; or a process for forming an undercoat layer, such as an SiN film and an SiO film, on the surface of the glass substrate in order to prevent alkali metal components included in the glass substrate from not diffusing to a semiconductor thin film.

Next, as represented in the illustrations (b1) and (b2) in FIG. 1, a thin film, such as a non-crystalline semiconductor thin film, is formed above the substrate 11 (a thin-film forming process). For example, a non-crystalline silicon thin film 15, such as an amorphous silicon film, is formed above the substrate 11. The non-crystalline silicon thin film 15 may have a film thickness of, for example, between 30 nm and 200 nm inclusive.

Then, as represented in the illustrations (c1) and (c2) in FIG. 1, the next process is executed as follows (a laser beam emitting process): A laser beam 30 having a predetermined light intensity distribution is prepared as a beam having a predetermined wavelength; the laser beam 30 is scanned relative to the non-crystalline silicon thin film 15 at a predetermined constant speed in a scanning direction 40 and the non-crystalline silicon thin film 15 is irradiated with the laser beam 30. The embodiment utilizes an yttrium-aluminum-argon (YAG) continuous wave laser (continuous wave laser, or CW laser) as a beam having a predetermined wavelength.

The laser-beam emitting process involves scanning the laser beam 30 along the direction of the largest residual stress identified in the substrate preparing process. In other words, the laser beam 30 scans in a manner that the scanning direction 40 of the laser beam is in the direction of the largest residual stress. Here, the laser beam 30 may scan in a manner that the scanning direction of the laser beam 30 goes in parallel with the direction of the largest residual stress. In the embodiment, the direction of the largest residual stress on the substrate 11 is the X-axis direction. Hence, as represented in the illustration (c2) in FIG. 1, the laser beam 30 scans along the X-axis direction.

When the laser beam 30 scans, the heat energy of the laser beam 30 anneals and crystallizes a predetermined region included in the non-crystalline silicon thin film 15 and irradiated with the laser beam 30, and the predetermined region becomes, for example, crystalline silicon. Hence, the non-crystalline silicon thin film 15 is crystallized to be a crystalline silicon thin film 16 including the crystallized region. In the embodiment, the whole surface of the non-crystalline silicon thin film 15 is irradiated with the laser beam 30 and crystallized over its entire region.

It is noted that the intensity-distribution profile on the surface of the non-crystalline silicon thin film 15 irradiated with the laser beam 30 is shaped in an approximate rectangular whose short axis goes in the scanning direction 40 of the laser beam 30 and long axis intersects with the scanning direction 40. Hence, the emission profile of the laser beam 30 on the surface of the non-crystalline silicon thin film 15 is also shaped in an approximate rectangular whose short axis goes in the scanning direction 40 of the laser beam 30 and long axis intersects with the scanning direction 40. Moreover, the illustration (c2) in FIG. 1 shows on the top a curve which exemplifies an intensity distribution of the laser beam 30 in the short-axis direction. The intensity distribution is formed by a Gaussian curve, for example.

Then, the non-crystalline silicon thin film 15 is irradiated with the laser beam 30 until the laser beam 30 arrives at a predetermined position. The illustrations (d1) and (d2) in FIG. 1 show the completion of crystallizing the predetermined region of the non-crystalline silicon thin film 15.

Figure 2A:
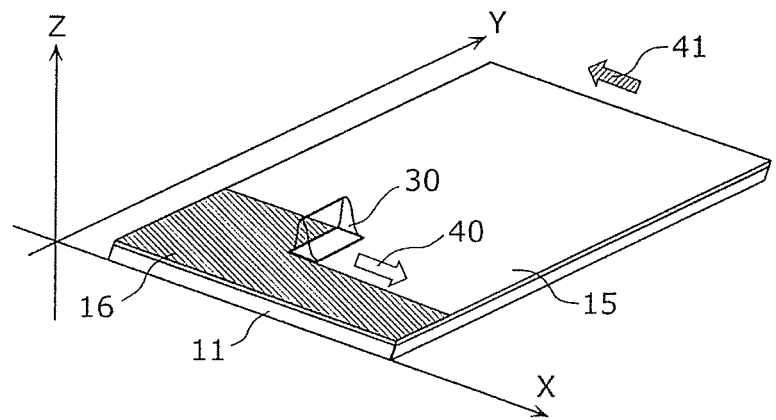
FIG. 2A schematically represents a perspective view illustrating how a non-crystalline silicon thin film is irradiated with a laser beam in a laser beam emitting process in the method for forming the crystalline thin film according to the embodiment of the present invention.
Figure 2B:
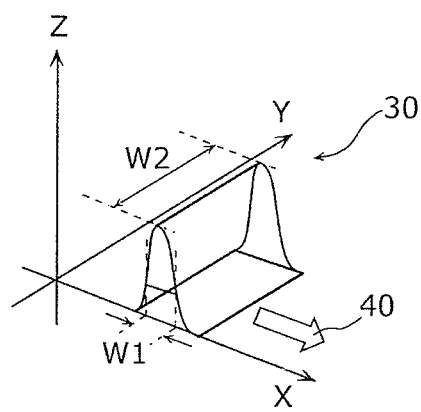
FIG. 2B represents an intensity distribution of the laser beam used in the laser beam emitting process in the method for forming the crystalline thin film according to the embodiment of the present invention.

Here, FIGS. 2A and 2B illustrate in detail how the non-crystalline silicon thin film 15 is crystallized in the laser-beam emitting process.

FIG. 2A schematically represents a perspective view illustrating how a non-crystalline silicon thin film is irradiated with a laser beam in the laser beam emitting process in the method for forming the crystalline thin film according to the embodiment of the present invention. FIG. 2B represents an intensity distribution (a beam profile) of the laser beam used in the laser beam emitting process in the method for forming the crystalline thin film according to the embodiment of the present invention.

As illustrated in FIG. 2A, in crystallizing with the laser beam 30 the non-crystalline silicon thin film 15 formed above the substrate 11, the laser beam 30 is scanned relative to the non-crystalline silicon thin film 15 in the scanning direction 40. In other words, at least one of the laser beam 30 and the substrate 11 is moved and the laser beam 30 is scanned relative to the non-crystalline silicon thin film 15. In the embodiment, the laser beam 30 (a laser beam emitting apparatus) is stationary, and, as illustrated in FIG. 2A, a stage (not shown) to which the substrate 11 having the non-crystalline silicon thin film 15 is provided is moved in a first direction 41 in the X-axis direction that is the direction of the largest residual stress on the substrate 11. Thus, the laser beam 30 scans the non-crystalline silicon thin film 15 in the scanning direction 40 (a second direction which is opposite the first direction in the X-axis direction). It is noted that, after each scan in the X-axis direction, the substrate 11 is moved in the Y-axis direction and again in the X-axis direction for another scan. The scans in the X-axis direction are repeated for multiple times, and the laser beam 30 can be emitted to the entire region of the non-crystalline silicon thin film 15.

Preferably, the light source of the laser beam 30 may be a CW laser as used in the embodiment. CW lasers are continuously oscillated laser beams and can travel faster than pulse lasers. Moreover, a CW laser is one digit faster than a pulse laser in scanning speed, which contributes to easily reducing the scanning time. The laser beam 30 may have the wavelength of 405 nm to 632 nm inclusive. For example, the laser beam 30 may be a CW laser including a semiconductor laser in green light having the wavelength of 532 nm.

As show in FIG. 2B, the laser beam 30 is formed in a manner that (i) the light intensity distribution in the short-axis (the X axis) direction appears in a convex-upward distribution represented as the Gaussian distribution, and (ii) the light intensity distribution in the long-axis (the Y axis) perpendicular to the short-axis direction appears in a flat-top distribution. It is noted that, in FIG. 2B, the beam half width W1 of the laser beam 30 represents the full width at half largest (FWHM) of the intensity distribution of the laser beam 30 in the short-axis direction. In FIG. 2B, the beam long-axis width W2 of the laser beam 30 represents the width (width in flat) of the intensity distribution in the long-axis direction in the long-axis direction of the laser beam 30. When emitted to the non-crystalline silicon thin film 15, the above-generated laser beam 30 relatively scans the non-crystalline silicon thin film 15 in a manner that the short-axis direction of the intensity distribution of the laser beam 30 is the scanning direction 40. As described above, the laser beam 30 having the intensity distribution illustrated in FIG. 2B is emitted to the non-crystalline silicon thin film 15, and the emission profile of the laser beam 30 on the non-crystalline silicon thin film 15 can be formed in an approximate rectangular. For example, the emission profile can be formed to have the beam half width W1 of 32 μm and the beam long-axis width W2 of 300 μm in a manner that the beam long-axis width W2 is longer than the beam half width W1.

Described next in detail are effects of the method for forming the crystalline thin film according to the embodiment of the present invention, as well as the background to the present invention, with reference to FIGS. 3A to 8B.

First, the inventors of the present invention have found out that the crystallization with a laser beam of a thin film formed above causes an increase in amount of warpage and shrinkage of the substrate. This is because the thin film is irradiated with the laser beam, followed by a rise in temperature of the thin film. The heat generated in the thin film is conducted to the substrate, resulting in an increase in substrate temperature. In other words, the rise in the substrate temperature by thermal load due to the laser beam would cause the shrinkage and warpage of the substrate.

In particular, when a CW laser is used as a laser beam for crystallization of the thin film, the irradiation of the thin film with the laser beam takes the heat input time of the order of microseconds (50 μsec to 100 μsec inclusive, for example). The heat input time of the CW laser beam is extremely longer than an input time, which is in the order of nanoseconds, of an excimer laser (30 nsec, for example) and of a YAG pulse laser (30 nsec to 150 nsec, for example). The resulting crystallization of the thin film with the CW laser is likely to cause the shrinkage and warpage of the substrate. In other words, when the CW laser is used as a source of a laser beam for crystallizing the thin film, the substrate apparently appears to suffer from an increase in amount of warpage and shrinkage. Moreover, the YAG laser beam and a beam for heating a lamp, as well as of the CW laser, take a long heat input time, and the substrate apparently appear to suffer from an increase in amount of warpage and shrinkage.

Furthermore, the inventors have found out from an experiment that, in an emission direction (scanning direction) of the laser beam and a direction vertical to the emission direction (a direction perpendicular to the scanning direction), anisotropy in amount of warpage and shrinkage is observed on the surface of the substrate. The anisotropy shall be described with reference to FIGS. 3A and 3B.

Figure 3A:
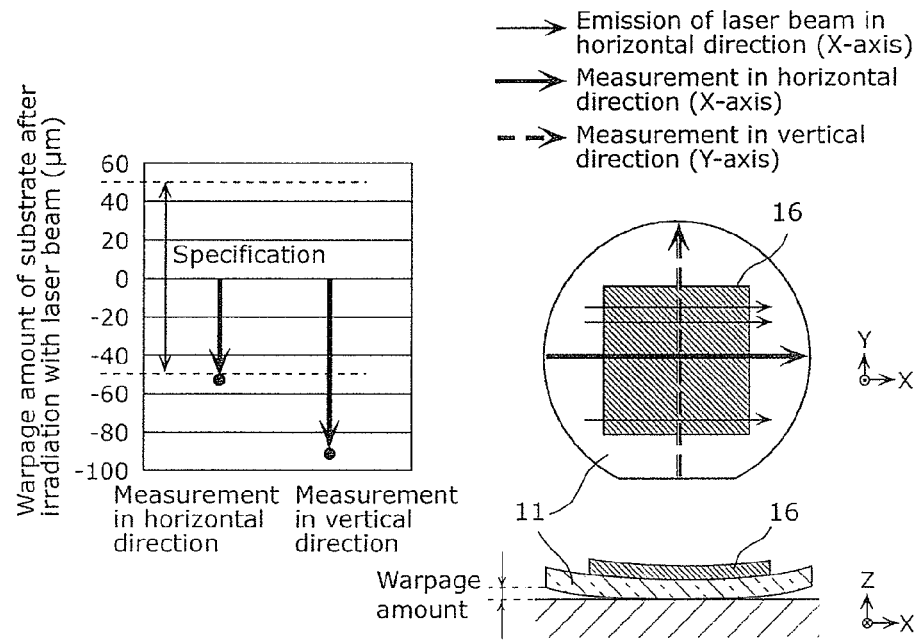
FIG. 3A represents a result of measuring warpage amounts of a substrate along the lateral direction and the longitudinal direction on the substrate, after irradiation of the substrate with the laser beam.

FIG. 3A represents a result of measuring warpage amounts of a substrate along the lateral direction and the longitudinal direction in the substrate, after irradiation of the substrate with the laser beam.

As the illustration on the right in FIG. 3A represents, in this experiment, a 6-inchφ (0.7 mm in thickness) glass substrate with orientation flat was prepared as the substrate 11. A non-crystalline silicon film was formed above the substrate 11 and irradiated with a laser beam in the X-axis direction (the horizontal direction). The non-crystalline silicon thin film was crystallized to be the crystalline silicon thin film 16. The illustration on the left in FIG. 3A represents the result of measuring warpage amounts at end portions on the substrate 11 in the X-axis direction (the horizontal direction) and the Y-axis direction (the vertical direction). When the measurement result shows that a measured warpage amount is negative (−), an end portion of the substrate 11 warps upward. When the measured warpage amount is positive (+), the center portion of the substrate 11 warps upward. Moreover, in the experiment, the orientation flat of the substrate 11 is oriented in the X-axis direction.

According to the measurement result in FIG. 3A, the warpage amount was approximately −55 μm when the laser beam was emitted along the X-axis direction (the horizontal direction) and was approximately −90 μm when the laser beam was emitted along the Y-axis direction (the vertical direction). In other words, the warpage amount of the substrate 11 was found to vary between the emission direction (scanning direction) of the laser beam and the direction vertical to the emission direction—that is, the warpage amount of the substrate 11 was anisotropic.

It is noted that both the warpage amounts measured in the horizontal and vertical directions were found to exceed a specification in substrate chuck (a fixturable range of a substrate) of ±50 μm, and the flatness of the substrate appeared to be not secured. Hence, if the flatness of the substrate 11 is not ensured, disadvantageous limitations on a grip and transporting direction of the substrate would be imposed in vacuum chuck carried out when the substrate 11 is fixed to a stage.

Figure 3B:
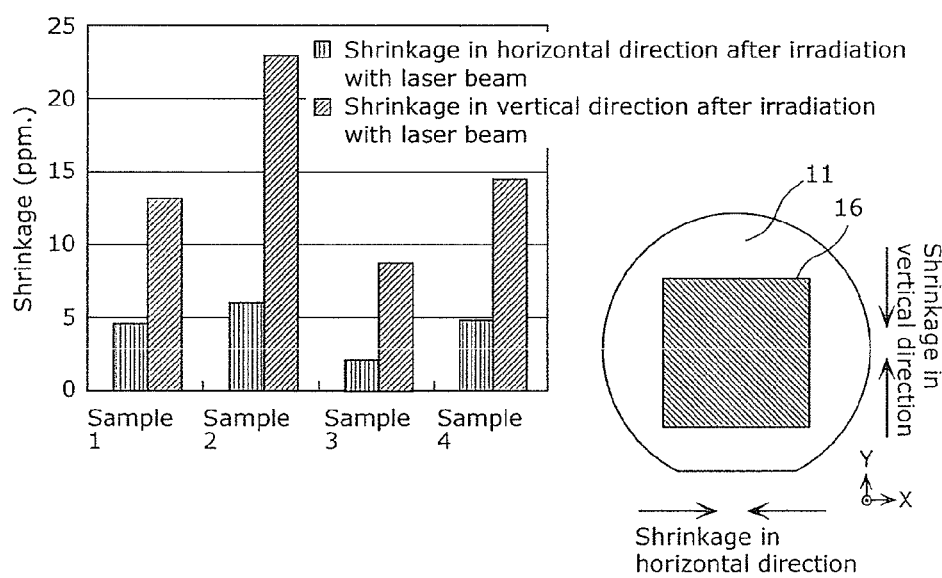
FIG. 3B represents a result of measuring shrinkage amounts of a substrate along the lateral direction and the longitudinal direction of the substrate, after the irradiation of the substrate with the laser beam.

FIG. 3B represents a result of measuring shrinkage amounts of a substrate along the lateral direction and the longitudinal direction of the substrate, after the irradiation of the substrate with the laser beam. In this experiment, as the one in FIG. 3A, four samples, each having a crystalline silicon thin film 16 formed on a substrate 11, were prepared for. Then a shrinkage amount of the substrate 11 was measured for each of the four samples.

According to the measurement result represented in FIG. 3B, any of the samples shows that the shrinkage amount of the substrate 11 in the Y-axis direction (the horizontal direction) after the irradiation with the laser beam is twice as great as or greater than the shrinkage amount (the shrinkage amount in the horizontal direction) of the substrate 11 in the X-axis direction (the horizontal direction) after the irradiation with the laser beam. In other words, anisotropy in shrinkage amount of the substrate 11 was found between the emission direction (scanning direction) of the laser beam and the direction vertical to the emission direction. Hence, when the anisotropy in amount of shrinkage and warpage is found on the surface of the substrate 11, the shrinkage amount cannot be corrected by an exposure apparatus in the following subsequent photolithography process since the zoom mechanism of the exposure apparatus is isotropic. This inability to shrinkage amount correction could cause pattern misalignment.

Hence, according to the experimental results represented in FIGS. 3A and 3B, the inventors of the present invention have found out that anisotropy in amount of warpage and shrinkage is observed on the surface of the substrate in an emission direction (scanning direction) of the laser beam and a direction vertical to the emission direction.

Figure 4:
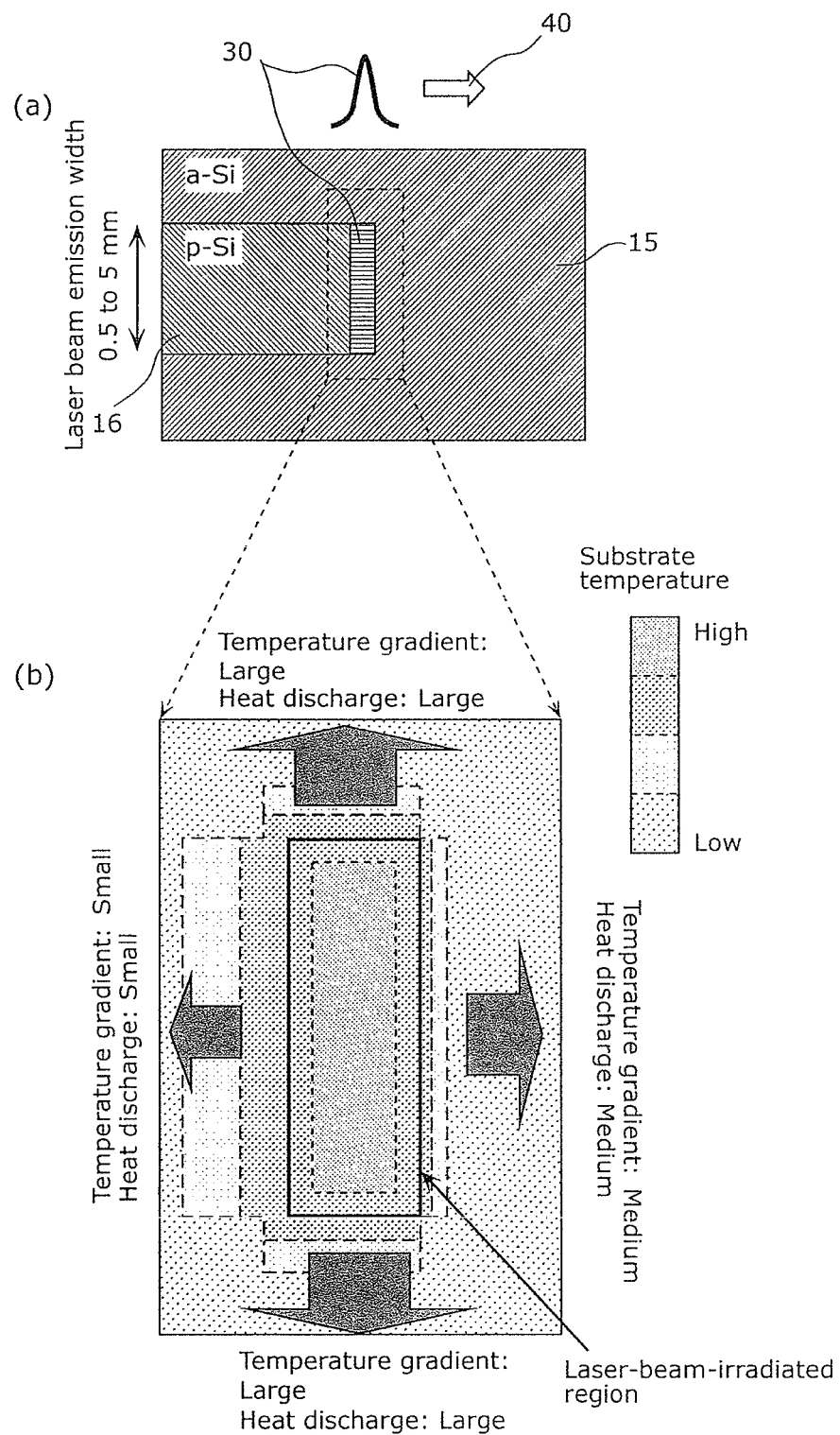
FIG. 4 represents in an illustration (a) a plan view which schematically illustrates how the non-crystalline silicon thin film is irradiated with the laser beam, and in an illustration (b) a view which schematically illustrates a substrate temperature gradient observed around a laser-beam irradiated region in the illustration (a).

After thorough studies on the cause of the anisotropy, the inventors have found out that one of the factors of the anisotropy is a gradient in temperature of the substrate irradiated with the laser beam. The substrate temperature gradient shall be described with reference to FIG. 4. FIG. 4 represents in an illustration (a) a plan view which schematically illustrates how the non-crystalline silicon thin film is irradiated with the laser beam, and in an illustration (b) a view which schematically illustrates a substrate temperature gradient observed around a laser-beam irradiated region in the illustration (a).

As the illustration (a) in FIG. 4 shows, the non-crystalline silicon thin film 15 (an amorphous silicon film) formed above a glass substrate (not shown) is irradiated along the scanning direction 40 with the laser beam 30 (a CW laser) having a predetermined beam emission width. A region of the non-crystalline silicon thin film 15 irradiated with the laser beam 30 is crystallized to be the crystalline silicon thin film 16 (polycrystalline silicon thin film).

Here, the laser-beam-irradiated region of the non-crystalline silicon thin film 15 produces a temperature gradient due to the intensity distribution and the laser scanning direction of the laser beam. As represented in the illustration (b) in FIG. 4, conductive heat from the crystalline silicon thin film 16 produces in the substrate a temperature gradient similar to the one in the region.

As represented in the illustration (b), the temperature gradient of the substrate is relatively small in the direction opposite the laser beam scanning direction 40, because the light-intensity distribution is of a Gaussian curve in the scanning direction 40 (the short axis) of the laser beam 30 and the crystalline silicon thin film 16 has remaining heat. The resulting heat discharge from the substrate is also relatively small.

Moreover, the temperature gradient of the substrate is relatively medium in the scanning direction 40 of the laser beam because, in the scanning direction 40 (the short axis) of the laser beam 30, the light-intensity distribution is of a Gaussian curve. The resulting heat discharge from the substrate is also relatively small.

Furthermore, the temperature gradient of the substrate is relatively large in the direction vertical to the laser beam scanning direction 40 (the direction perpendicular to the scanning direction 40 in the same plane as the one including the scanning direction 40), because the substrate is not irradiated with the laser beam 30 and does not take thermal load. The resulting heat discharge from the substrate is also relatively large.

As described above, the substrate whose thin film is irradiated with the laser beam develops anisotropy in temperature gradient and heat discharge in the laser beam scanning direction 40, in the direction opposite the laser beam scanning direction 40, and in the direction vertical to the laser beam scanning direction 40. Such anisotropy causes a difference in cooling rate depending on direction. As a result, the substrate also develops anisotropy in amount of warpage and shrinkage.

In other words, the cooling rate is relatively small in the direction opposite the laser beam scanning direction 40, and so are the amounts of warpage and shrinkage of the substrate. Moreover, the cooling rate is relatively medium in the laser beam scanning direction 40, and so are the amounts of warpage and shrinkage of the substrate. Furthermore, the cooling rate is relatively large in the direction vertical to the laser beam scanning direction 40, and so are the amounts of warpage and shrinkage of the substrate.

Based on the above studies, the inventors of the present invention have found out that anisotropy in amount of warpage and shrinkage appears in the substrate in the laser beam scanning direction 40 (the emission direction) and the direction vertical to the laser beam scanning direction 40. In particular, as represented in FIG. 4, the inventors have found out that it is in the direction vertical to the laser beam scanning direction 40 that a warpage amount and a shrinkage amount of the substrate increase most. It is noted that warpage amounts and shrinkage amounts of the substrate are caused by the temperature gradient of the substrate developed near the laser-beam irradiated region, regardless of the size and shape of the substrate. As described above, the warpage amounts and the shrinkage amounts have relative magnitude relationships, depending on the laser beam scanning direction 40.

The inventors of the present invention have conducted thorough studies on schemes to curb an increase in amount of warpage and shrinkage of the substrate by laser-beam irradiation, and found out that the use of anisotropy in residual stress developed in manufacturing the substrate will curb such an increase in amount of warpage and shrinkage of the substrate by laser-beam irradiation.

Figure 5:
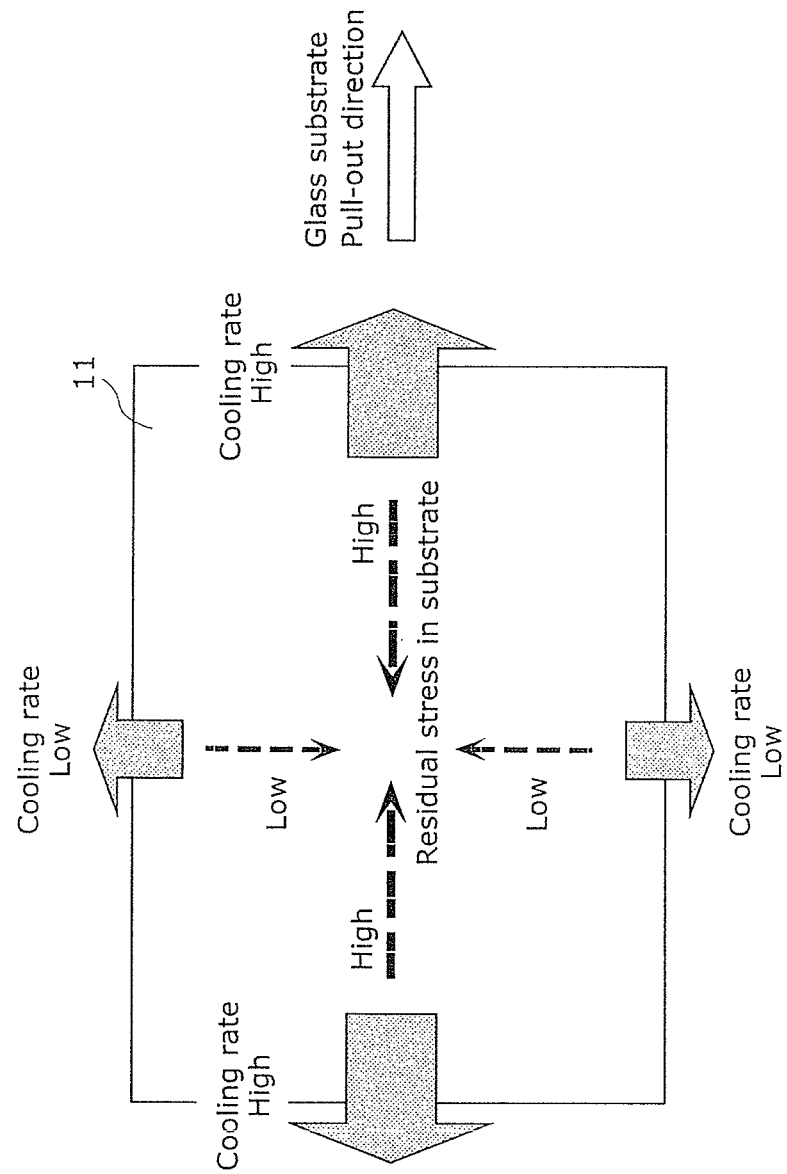
FIG. 5 represents a view to illustrate a residual stress in the substrate and developed when the substrate is manufactured.

Described here is the residual stress developed in manufacturing the substrate, with reference to FIG. 5. FIG. 5 represents a view to illustrate a residual stress in the substrate and developed when the substrate is manufactured.

When the substrate 11 is a glass substrate, as represented in FIG. 5, techniques to form a glass substrate for display-use include over floating, fusing, and floating. These techniques involve thermally processing molten glass which is a precursor of the substrate 11 to form a plate-like glass substrate. In the over floating and floating, for example, melt glass (molten glass) is vertically or horizontally stretched and cooled to be a plate-like glass substrate.

Here, in a direction in which the molten glass is stretched and pulled out as a glass substrate (pull-out direction), the substrate 11 has a large temperature gradient because of annealing in the pull-out direction. The resulting cooling rate (heat-release rate) is relatively high. In contrast, in the direction perpendicular to the pull-out direction of the glass substrate, the substrate 11 is uniform in temperature and has a small temperature gradient. The resulting cooling rate (heat-release rate) is relatively low.

Hence, due to the manufacturing technique of the glass substrate, the cooling rate of a glass substrate varies between the pull-out direction of the glass substrate and the direction perpendicular to the pull-out direction. The difference in cooling rate develops anisotropy in residual stress found in the glass substrate. Then the residual stress in the pull-out direction of the glass substrate is greater than that in the direction perpendicular to the pull-out direction of the glass substrate, and the residual stress in the pull-out direction of the glass substrate is the largest residual stress. In other words, the direction of the largest residual stress is a direction in which the glass substrate is stretched.

In other words, the glass substrate warps due to a residual stress in the substrate from the beginning. The glass substrate has already slightly warped before irradiation with a laser beam, and the warpage amount is greatest in the direction of the largest residual stress. Hence, if the pull-out direction of the glass substrate is previously found, the pull-out direction is identified as the direction of the largest residual stress. Even though the pull-out direction of the glass substrate is not found, residual stresses in the glass substrate are measured by measuring warpage amounts in multiple directions on the glass substrate. The direction in the largest warpage amount among the warpage amounts on the glass substrate can be identified as the direction of the largest residual stress in the glass substrate. In the case of a rectangular glass substrate, for example, measured are warpage amounts at the end portions in the longitudinal direction through the center of the substrate and warpage amounts at the end portions in the short direction through the center of the substrate. The direction in which the greater warpage amounts appear can be identified as the direction of the largest residual stress.

It is noted that regardless of a method for manufacturing the glass substrate, the substrate has a residual stress therein. In other words, measuring warpage amounts in the glass substrate can identify the direction of the largest residual stress.

In the embodiment, the substrate 11 is a glass substrate. Instead, the substrate 11 may be a plastic substrate (a resin substrate) having features similar to the ones that the glass substrate has. In the case of a plastic substrate, the precursor of the substrate is a plastic material heated higher than or equal to a transition temperature. The plastic material is thermally processed in a plate-like substrate. Techniques to form a plastic substrate include extrusion molding, solution casting, calendaring, and stretching. It is noted that, when a plastic substrate is stretched in a shape, the pull-out direction is the direction of the largest residual stress. Moreover, the direction of the largest residual stress in a plastic substrate may be identified by measuring warpage amounts in multiple directions on the plastic substrate.

As described above, the residual stress found in the substrate 11 has anisotropy. As for the substrate 11 which is pulled out and formed in a shape, the pull-out direction of the substrate is the direction of the largest residual stress.

The present invention is conceived in view of the above underlying knowledge. The inventors of the present invention looked at the anisotropy in residual stress on the substrate 11 prior to irradiation with a laser beam and the anisotropy in amount of warpage and shrinkage of the substrate 11 irradiated with the laser beam, and have devised an idea to determine a scanning direction (an emission direction) of the laser beam based on the anisotropy in residual stress in the substrate 11.

Figure 6:
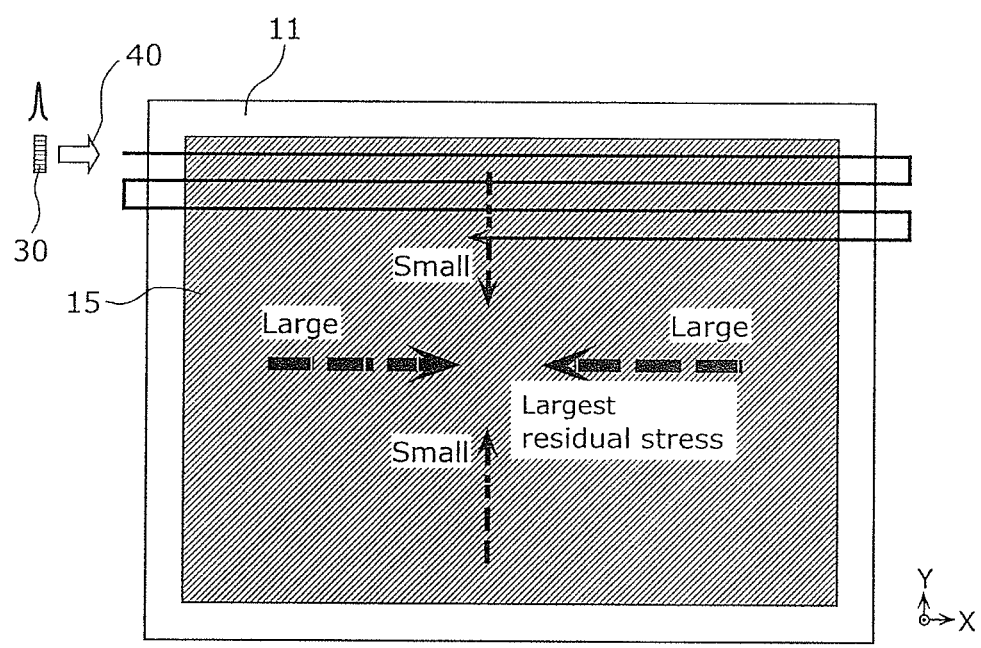
FIG. 6 represents a view to illustrate a laser beam emitting process in the method for forming the crystalline thin film according to the embodiment of the present invention.

Specifically, the inventors have found out that the direction of the largest residual stress on the substrate 11 may be identified and the laser beam 30 may scan in the identified direction of the largest residual stress. In other words, as represented in FIG. 6, the direction of the largest residual stress on the substrate 11 and the scanning direction 40 of the laser beam 30 may be matched to go in the same direction in crystallizing the non-crystalline silicon thin film 15 using the laser beam 30, and the anisotropy in residual stress on the substrate 11 and the anisotropy in amount of warpage and shrinkage of the substrate 11 caused by the laser beam irradiation may be eased. Such features contribute to curbing an increase in amount of warpage and shrinkage which are caused by the laser beam irradiation and appear on the entire substrate.

Figure 7A:
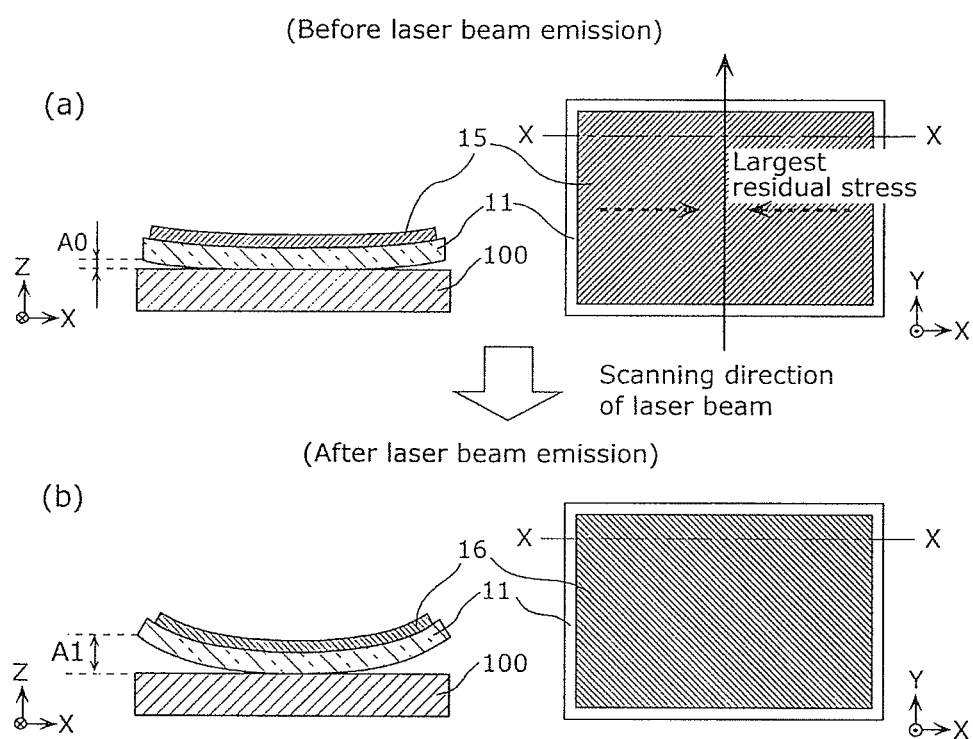
FIG. 7A (a) and (b) represents a view to illustrate a change in warpage amount of a substrate before and after irradiation with a laser beam in a method for forming a crystalline thin film according to a comparative example.
Figure 7B:
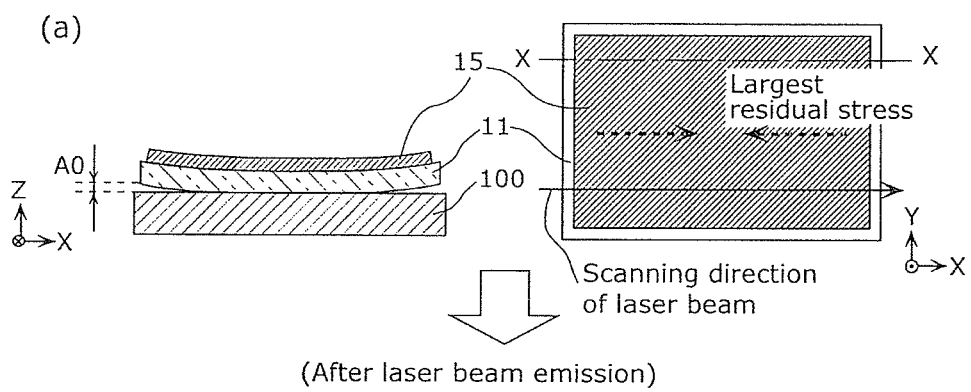
FIG. 7B (a) and (b) represents a view to illustrate a change in warpage amount of a substrate before and after the irradiation with the laser beam in the method for forming the crystalline thin film according to the embodiment of the present invention.
Figure 7B:
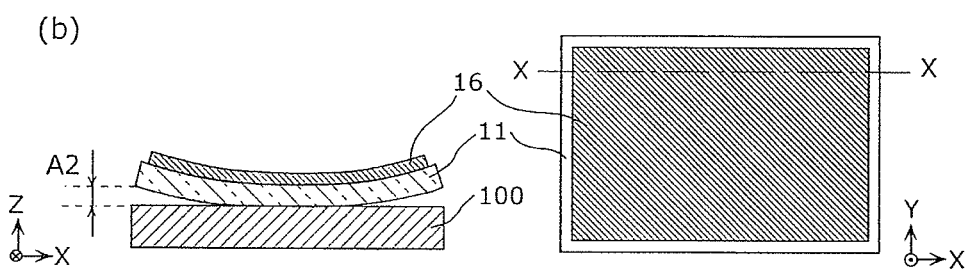

The features shall be described with reference to FIGS. 7A and 7B. FIG. 7A represents a view to illustrate a change in warpage amount of a substrate before and after irradiation with a laser beam in a method for forming a crystalline thin film according to a comparative example. FIG. 7B represents a view to illustrate a change in warpage amount of a substrate before and after the irradiation with the laser beam in the method for forming the crystalline thin film according to the embodiment of the present invention.

The illustration (a) in FIG. 7A shows that if the laser beam 30 scans in the Y-axis direction (the vertical direction) when the direction of the largest residual stress on the substrate 11 is the X-axis direction (the horizontal direction) before the laser beam emission (in other words, if the laser beam 30 scans in the direction vertical to the direction of the largest residual stress on the substrate 11), the warpage amount and the shrinkage amount of the substrate 11 caused by the laser beam 30 will be the greatest in the direction vertical to the scanning direction (the X-axis direction) of the laser beam 30 as described above. Such scanning matches (i) the direction of the largest residual stress (the X-axis direction) on the substrate 11 and (ii) the direction (the Y-axis direction) in which the warpage amount and the shrinkage amount of the substrate 11 caused by the laser beam 30 are the greatest. Hence, as represented in the illustration (b) in FIG. 7A, the laser beam adds, after its emission, the largest warpage amount to a large warpage amount (A0) which has originally appeared in the X-axis direction (the horizontal direction). Consequently, the substrate 11 has a warpage amount (A1), in the X-axis direction (the horizontal direction), which is significantly greater than the warpage amount (A0) found before the laser beam emission (A1>A0).

In contrast, as represented in the illustration (a) in FIG. 7B, the laser beam 30 in the embodiment scans in the X-axis direction (the horizontal direction) in a manner that the direction of the largest residual stress on the substrate 11 and the scanning direction of the laser beam 30 may be matched to go in the same direction, when the direction of the largest residual stress on the substrate 11 is the X-axis direction before the emission of the laser beam. Hence, the warpage amount and the shrinkage amount of the substrate 11 caused by the laser beam 30 are the greatest in the direction (the Y-axis direction) vertical to the scanning direction of the laser beam 30. Consequently, such scanning does not match (i) the direction of the largest residual stress (the X-axis direction) on the substrate 11 and (ii) the direction (the Y-axis direction) in which the warpage amount and the shrinkage amount of the substrate 11 caused by the laser beam 30 are the greatest, and moves the directions 90 degrees away from each other. In other words, the direction of the largest residual stress (the X-axis direction) on the substrate 11 coincides with the direction (the X-axis direction) in which the warpage amount and the shrinkage amount of the substrate 11 caused by the laser beam 30 are the smallest. Hence, as represented in the illustration (b) in FIG. 7B, the laser beam adds, after its emission, the minimum warpage amount alone to the greatest warpage amount (A0) which has originally appeared in the X-axis direction (the horizontal direction). Consequently, the substrate 11 has a warpage amount (A2), in the X-axis direction (the horizontal direction), which is not as great as the warpage amount (A1) in the illustration (b) in FIG. 7A but is slightly greater than the warpage amount (A0) found before the laser beam emission (A1>A2>A0).

As described above, the method for forming the crystalline thin film according to the embodiment involves identifying the direction of the largest residual stress on the substrate 11 and then causing the laser beam 30 to scan along the identified direction of the largest residual stress. Such features contribute to curbing an increase in amount of warpage and shrinkage which are caused by irradiation with the laser beam 30 and appear on the entire substrate, and improving in the flatness of the substrate 11. Hence, the warpage amount of the substrate 11 can be kept within a range in which the substrate 11 can be fixed to a manufacturing apparatus. Consequently, when the substrate 11 is fixed to a stage of the manufacturing apparatus in the subsequent manufacturing processes, substrate chuck such as vacuum chuck can be appropriately executed.

In addition, as described above, the temperature gradient caused by the irradiation with the laser beam 30 develops anisotropy in amount of warpage and shrinkage of the substrate 11. In the embodiment, however, the laser beam 30 scans along an identified direction of the largest residual stress, and an in-plane anisotropy in amount of warpage and shrinkage of the substrate 11 due to the temperature gradient caused by the irradiation with the laser beam 30 and an in-plane anisotropy in residual stress on the substrate 11 act with each other in a manner that the in-plane anisotropies cancel the other out. Such a feature allows warpage amounts and shrinkage amounts of the substrate 11 irradiated with the laser beam 30 to be isotropic in the substrate, which makes it possible in the subsequent photolithography process to correct the shrinkage amounts using the zoom mechanism of an exposure apparatus and to facilitate predetermined exposure. Consequently, pattern misalignment can be prevented in the photolithography process after the irradiation with the laser beam 30.

Figure 8A:
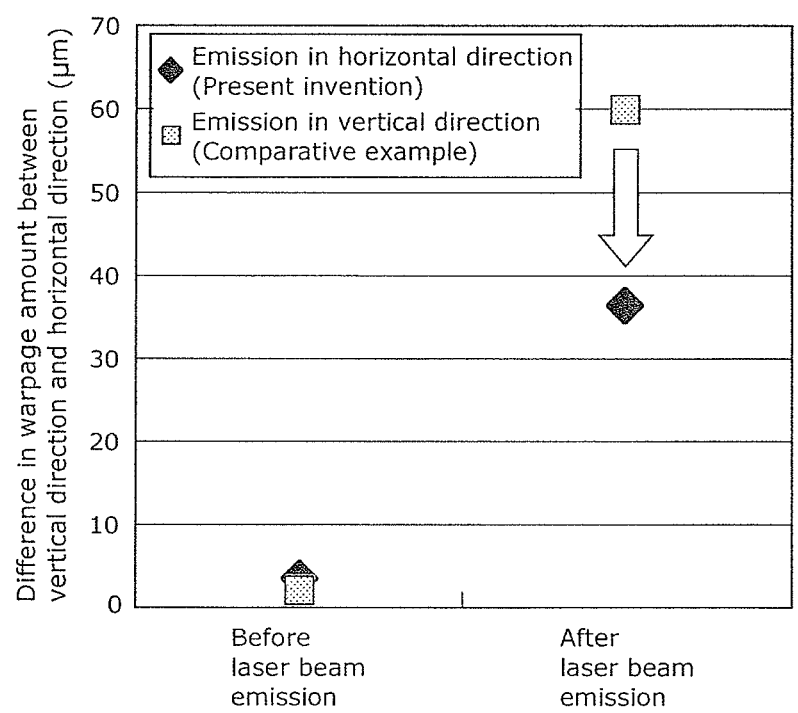
FIG. 8A represents a view to illustrate an advantage of the method for forming the crystalline thin film according to the embodiment of the present invention.
Figure 8B:
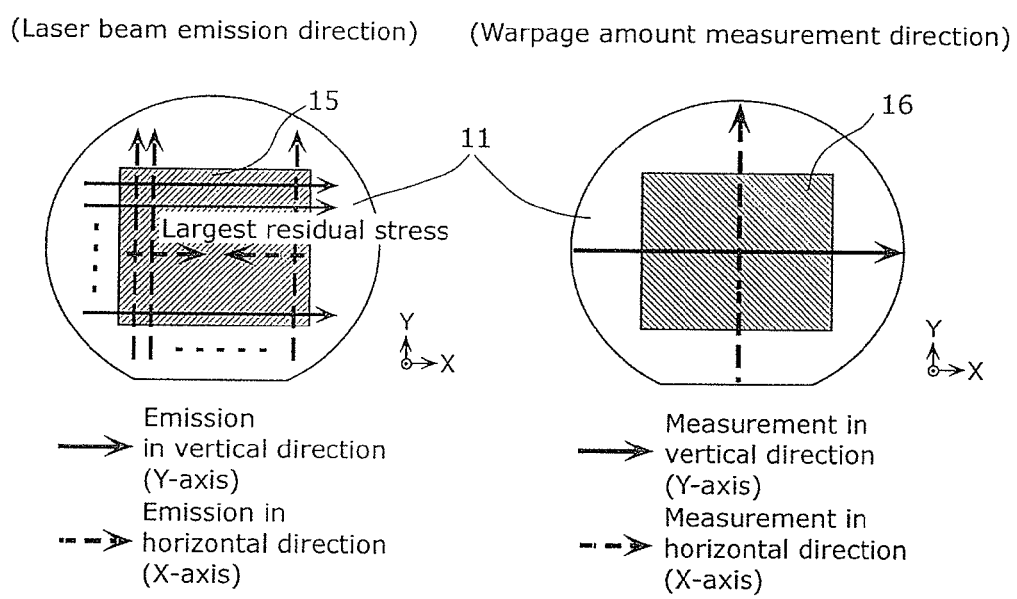
FIG. 8B represents a view to illustrate a measurement condition in FIG. 8A.

An experiment was conducted to examine the effects of the present invention. Described hereinafter are results of the experiment, with reference to FIGS. 8A and 8B. FIG. 8A represents a view to illustrate an advantage of the method for forming the crystalline thin film according to the embodiment of the present invention. FIG. 8A illustrates warpage amounts on a substrate in the vertical direction and the horizontal direction before and after laser beam emission. FIG. 8B represents a view to illustrate a measurement condition in FIG. 8A. FIG. 8B illustrates directions of a laser beam (on the left) emitted to the non-crystalline silicon thin film 15 formed above the substrate 11, and directions in which substrate warpage amounts are measured (on the right) on the substrate 11 that has become the crystalline silicon thin film 16 by the laser beam emission.

In the experiment, moreover, the above-described 6-inchϕ (0.7 mm in thickness) glass substrate with orientation flat is used as the substrate 11. The orientation flat of the substrate 11 is oriented in the horizontal direction (the X-axis direction), and the direction vertical to the orientation flat is the vertical direction (the Y-axis direction). It is noted that the glass substrate is pulled out in a horizontal direction with respect to the substrate, and the horizontal direction with respect to the substrate (the X-axis direction) is the direction of the largest residual stress on the substrate. The condition of emitting the laser beam is the power density of 70 kW/cm$^2$, the scan rate (scan speed) of 380 mm/s, the beam long-axis width of 0.89 mm, and the scan pitch of 0.95 mm.

As a result, as shown in FIG. 8A, when the laser beam was emitted in the vertical direction (the Y-axis direction) that is different from the direction of the largest residual stress on the substrate (the case of the comparative example), the difference of approximately 2 μm was found before the laser beam emission between the substrate warpage amount at an end portion of the substrate in the horizontal direction and the substrate warpage amount at an end portion of the substrate in the vertical direction. After the laser beam emission, the difference increased to approximately 60 μm between the substrate warpage amount at an end portion of the substrate in the horizontal direction and the substrate warpage amount at an end portion of the substrate in the vertical direction.

In comparison, when the laser beam was emitted in the horizontal direction (the X-axis direction) that is the same as the direction of the largest residual stress on the substrate (the case of the present invention), the difference of approximately 3 μm was found before the laser beam emission between the substrate warpage amount at an end portion of the substrate in the horizontal direction and the substrate warpage amount at an end portion of the substrate in the vertical direction. After the laser beam emission, the difference increased only to approximately 37 μm between the substrate warpage amount at an end portion of the substrate in the horizontal direction and the substrate warpage amount an end portion of the substrate in the vertical direction. In other words, a curb on an increase in warpage amount of the substrate 11 was confirmed.

In the embodiment, the laser beam 30 scans along the direction of the largest residual stress (in other words, the direction of the largest residual stress and the laser beam 30 are approximately matched, and the direction of the largest residual stress and the scanning direction of the laser beam form an angle of approximately 0 degrees). However, the embodiment shall not be limited to this. In the embodiment, the direction of the largest residual stress and the scanning direction of the laser beam may form an angle between zero degrees and 30 degrees inclusive. More preferably, the angle may be between zero degrees and 10 degrees inclusive. When the direction of the largest residual stress and the scanning direction of the laser beam form an angle between zero degrees and 30 degrees inclusive, the scanning direction of the laser beam 30 is oriented to the direction of the largest residual stress. Such a feature successfully achieves an effect of the present invention. In contrast, if the angle is greater than 50 degrees, for example, the scanning direction of the laser beam 30 is oriented toward the direction perpendicular to the direction of the largest residual stress. In this case, the resulting effect of the present invention is not significant.

Furthermore, for example, when a CW laser beam having a beam length of 5 mm or shorter repeatedly scans a thin film formed on a substrate having a large area, the thin film can be irradiated with a previous scan region and the current scan region overlapped with each other. In this case, however, the actual manufacturing facility might have a problem that the thin film cannot be irradiated with the regions overlapped due to the accuracy of the facility.

Here, high accuracy is required between the scanning direction of the laser beam and the setting (orientation and angle) of the substrate to avoid emitting the laser beam to a TFT portion of the subsequent scan region (irradiated region). Depending on the distance to move the substrate and the size of the TFT, the required accuracy of an angle is no more than or equal to 0.1 degrees.

In the present invention, even though the misalignment of two to three degrees is found between the direction of the largest residual stress and the laser beam scanning direction, effects of the present invention will be achieved without any problem. Hence, a variation in setting of a substrate in the actual manufacturing facility, designing of an alley portion on the substrate, or scanning by a laser beam scanning apparatus will not prevent the present invention from achieving its effects.

[A Method for Manufacture a Thin-Film Transistor]

Described next is how to manufacture a thin-film transistor according to the embodiment of the present invention. The method for manufacturing the thin-film transistor according to the embodiment involves forming a channel layer of the thin-film transistor, using the method for forming a crystalline thin film according to the embodiment.

The method for manufacturing a thin-film transistor according to the embodiment includes: preparing for a substrate (a substrate preparing process); forming a gate electrode above the substrate (a gate electrode forming process); forming a gate insulating film above the substrate (a gate insulating film forming process); forming a non-crystalline silicon thin film above the substrate (a non-crystalline silicon thin film forming process); forming a source electrode and a drain electrode above the substrate (a source electrode and drain electrode forming process); and irradiating the non-crystalline silicon thin film with a laser beam and crystallizing the non-crystalline silicon thin film to form a crystalline silicon thin film having a crystallized region (a crystalline silicon thin film forming process).

The crystalline silicon thin film forming process may be implemented in a similar manner as the laser beam emitting process (a crystallizing process) in the above method for forming the crystalline thin film. It is noted that the crystallized region obtained in the crystalline silicon thin film forming process is the channel layer of the thin-film transistor.

Here, the thin-film transistor is formed in either a bottom gate one or a top gate one. A bottom gate thin-film transistor has a layer structure of a gate electrode, a gate insulating film, and a channel layer (a silicon semiconductor film) from the bottom. In contrast, a top gate thin-film transistor has a layer structure of a channel layer, a gate insulating film, and a gate electrode from the bottom. Specifically described hereinafter is a method for manufacturing each of the bottom-gate thin-film transistor and the top-gate thin-film transistor with reference to the drawings.

Figure 9:
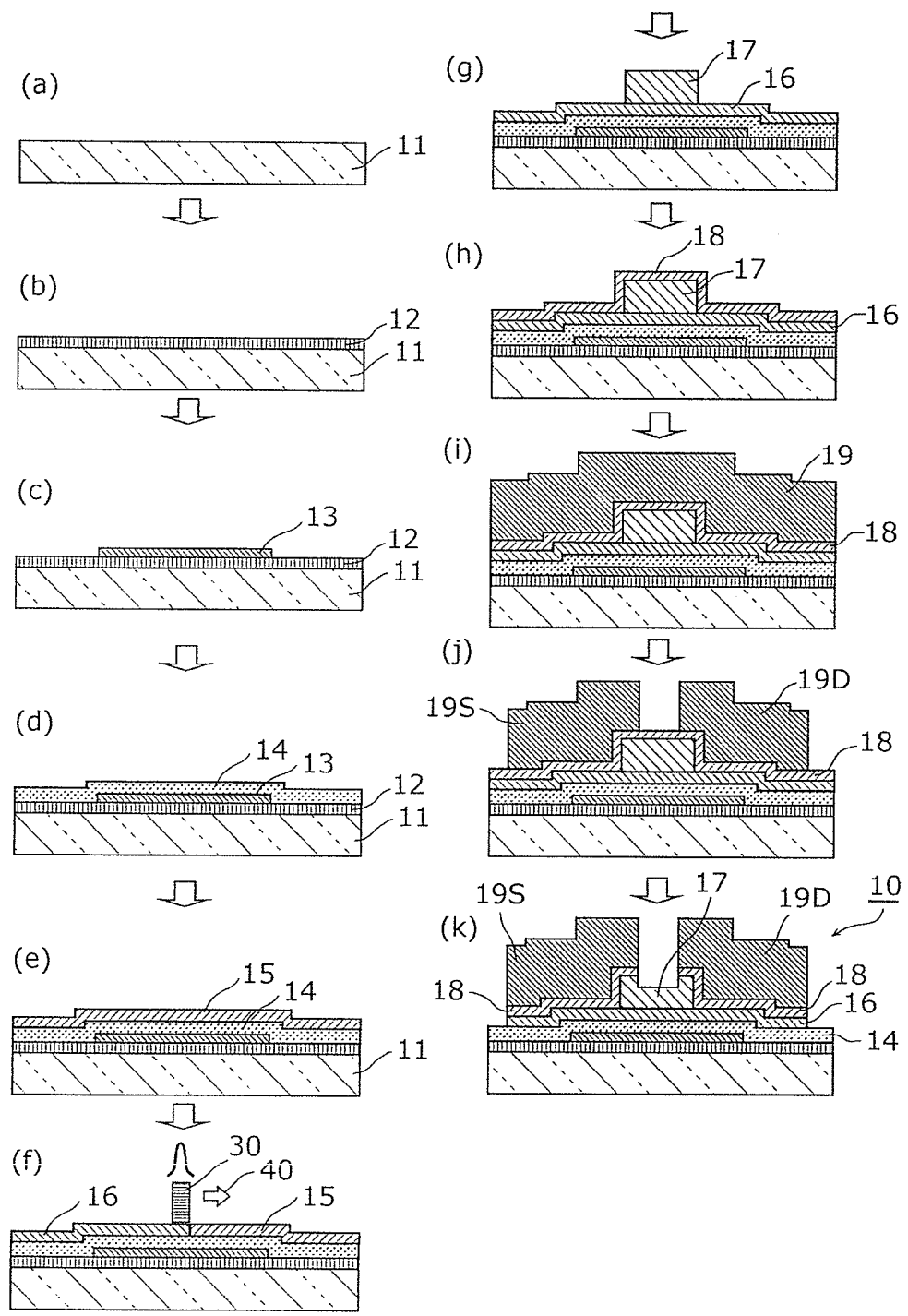
FIG. 9 (a)-(k) represents a cross-sectional view which schematically illustrates each of processes in a method for manufacturing a bottom-gate thin-film transistor according to the embodiment.

Described first is a method for manufacturing a bottom-gate thin-film transistor 10 according to the embodiment, with reference to FIG. 9. FIG. 9 represents a cross-sectional view which schematically illustrates each of processes in a method for manufacturing a bottom-gate thin-film transistor according to the embodiment.

First, as seen in the illustration (a) of FIG. 9, the substrate 11 is prepared and placed on a stage (not shown). The substrate 11 may be a glass substrate, for example.

Next, as seen in the illustration (b) of FIG. 9, an undercoat layer 12, which is made of an insulating film such as a silicon nitride film or a silicon oxide film, is formed above the substrate 11. The silicon nitride film or the silicon oxide film may be formed by plasma chemical vacuum deposition (CVD).

Then, as seen in the illustration (c) of FIG. 9, a gate electrode 13 formed in a predetermined shape is provided above the undercoat layer 12. For example, a gate metal film, which includes one of such as molybdenum (Mo), tungsten (W), copper (Cu), silver (Ag), aluminum (Al), chrome (Cr), titanium (Ti), tantalum (Ta) or an alloy including a combination thereof, is formed by sputtering. Then the gate metal film is patterned by photolithography and wet etching to form the gate electrode 13 provided in a predetermined shape.

Next, as seen in the illustration (d) in FIG. 9, a gate insulating film 14 is formed above the gate electrode 13 and an exposing portion of the undercoat layer 12 so as to cover the gate electrode 13. For example, above the entire surface of the substrate 11, one of a silicon oxide film and silicon nitride film, or a stacked film including thereof is formed above the gate electrode 13 as the gate insulating film 14 by plasma CVD.

Then, as seen in the illustration (e) in FIG. 9, the non-crystalline silicon thin film 15 is formed above the gate insulating film 14. For example, an amorphous silicon thin film is formed above the gate insulating film 14 as the non-crystalline silicon thin film 15 by plasma CVD.

After dehydrogenation annealing, as seen in the illustration (f) in FIG. 9, the laser beam 30 is scanned relative to the non-crystalline silicon thin film 15 in the predetermined scanning direction 40 in a manner that the non-crystalline silicon thin film 15 has a predetermined region irradiated with the laser beam 30. Hence, the non-crystalline silicon thin film 15 is crystallized to be the crystalline silicon thin film 16. The process is implemented by a technique similar to the laser beam emitting process included in the above-described method for manufacturing a crystalline thin film.

Then, as seen in the illustration (g) in FIG. 9, a channel protecting film 17 is formed above a channel region of the crystalline silicon thin film 16. For example, a predetermined organic material is applied above the crystalline silicon thin film 16 by a predetermined application technique, and prebaked. Then, the prebaked crystalline silicon thin film 16 is exposed and developed to be patterned. The resulting channel protecting film 17 is formed of an organic film in a predetermined shape.

Next, as seen in the illustration (h) in FIG. 9, a contact layer 18 is formed above the crystalline silicon thin film 16 so as to cover the channel protecting film 17. For example, including amorphous silicon doped with an impurity of a quinquevalent element such as phosphorous, the contact layer 18 (an $n^+$ layer) is formed by plasma CVD.

Then, as seen in the illustration (i) in FIG. 9, a source-drain metal film 19 is provided above a contact layer 18 so as to be a source electrode 19S and a drain electrode 19D. For example, the source-drain metal film 19, formed of Cu (copper) in a single-layer structure or of MoW/Al/MoW in a three-layer structure, is provided above the contact layer 18 by sputtering.

Then, as seen in the illustration (j) in FIG. 9, the source-drain metal film 19 is patterned and a pair of the source electrode 19S and the drain electrode 19D is separately formed. For example, the source electrode 19S and the drain electrode 19D in predetermined shapes are pattern-formed by applying a resist formed in a predetermined shape above the source-drain metal film 19 and wet-etching the source-drain metal film 19 using the resist as a mask.

Then, the contact layer 18 and the crystalline silicon thin film 16 are dry-etched while either (i) removing the resist above the source electrode 19S and the drain electrode 19D and using the source electrode 19S and the drain electrode 19D as masks or (ii) leaving the resist above the source electrode 19S and the drain electrode 19D, and patterned to be a pair of the contact layers 18 formed in predetermined shapes and the crystalline silicon thin film 16 shaped in an island (a channel layer) as seen in the illustration (k) in FIG. 9. It is noted that an etching gas for the dry etching may be, for example, a chlorine-based gas.

This is how the bottom-gate thin-film transistor 10 is manufactured. After that, the entire thin-film transistor 10 may be covered by a passivation film formed of an insulating film, including silicon nitride or silicon oxide, by CVD.

The method for manufacturing the bottom-gate thin-film transistor 10 according to the embodiment involves scanning using the laser beam 30 in the direction of the largest residual stress on the substrate 11 when the non-crystalline silicon thin film 15 is crystallized with the laser beam 30. Such a feature successfully curbs an increase in warpage amount of the substrate 11. Hence, in the following process, the substrate 11 can be firmly fixed to the stage.

As described above, manufacturing a bottom-gate thin-film transistor includes the first photolithography process for patterning the gate electrode 13 and the second photolithography process for patterning the source electrode 19S and the drain electrode 19D. Between the first and second photolithography processes is the laser-beam emitting process (the crystallizing process) for crystallizing the non-crystalline silicon thin film 15. Thus, an increase and anisotropy in amount of warpage and shrinkage of the substrate 11 in the laser-beam emitting process will cause the problem of pattern misalignment in the second photolithography process. Hence, a bottom-gate thin-film transistor severely suffers from warpage and shrinkage of the substrate 11 especially in the laser-beam emitting process.

In contrast, the method for manufacturing the thin-film transistor 10 according to the embodiment achieves an improvement in anisotropy in amount of warpage and shrinkage of the substrate 11, and allows a predetermined exposure to be carried out in the second photolithography process. In other words, the shrinkage amount of the substrate 11 can be corrected in a photolithography process by the zoom mechanism of the exposure apparatus, and pattern misalignment can be prevented between the first and second photolithography processes. The resulting production tolerance can be kept low, which contributes to manufacturing thin-film transistors having excellent in-plane uniformity.

Furthermore, even though the entire surface of the non-crystalline silicon thin film 15 is irradiated with the laser beam 30, the embodiment makes it possible to manufacture in a short time thin-film transistors having high carrier mobility and excellent in-plane uniformity. Such features shall be described below.

In a typical system-on-glass (SOG) display panel, a TFT in a pixel unit is preferably excellent in in-plane uniformity and manufactured in a short period of time. Hence, an excimer laser or a YAG laser having a short heat input time is used to crystallize the non-crystalline silicon thin film. The excimer laser or the YAG laser, however, does not allow the TFT to have excellent carrier mobility characteristics. In contrast, a TFT for a peripheral circuit unit provided near the pixel unit has to have high carrier mobility. Hence, a CW laser is used to crystallize the non-crystalline silicon thin film. The CW laser, however, causes variation in TFT characteristic and decreases in in-plane uniformity, as well as lowers productivity. Hence, in manufacturing the TFT included in a typical SOG display panel, no laser beam for crystallization satisfies both the requirements of the TFT for the pixel unit and of the TFT for the peripheral circuit unit.

In contrast, the crystallization using a CW laser according to the embodiment makes it possible to manufacture a TFT having excellent in-plane uniformity in a short time. Hence, even though the entire surface of the non-crystalline silicon thin film is to be irradiated with a CW laser beam, the embodiment makes it possible to manufacture a thin-film transistor having excellent in-plane uniformity and high carrier mobility in a short time.

Figure 10:
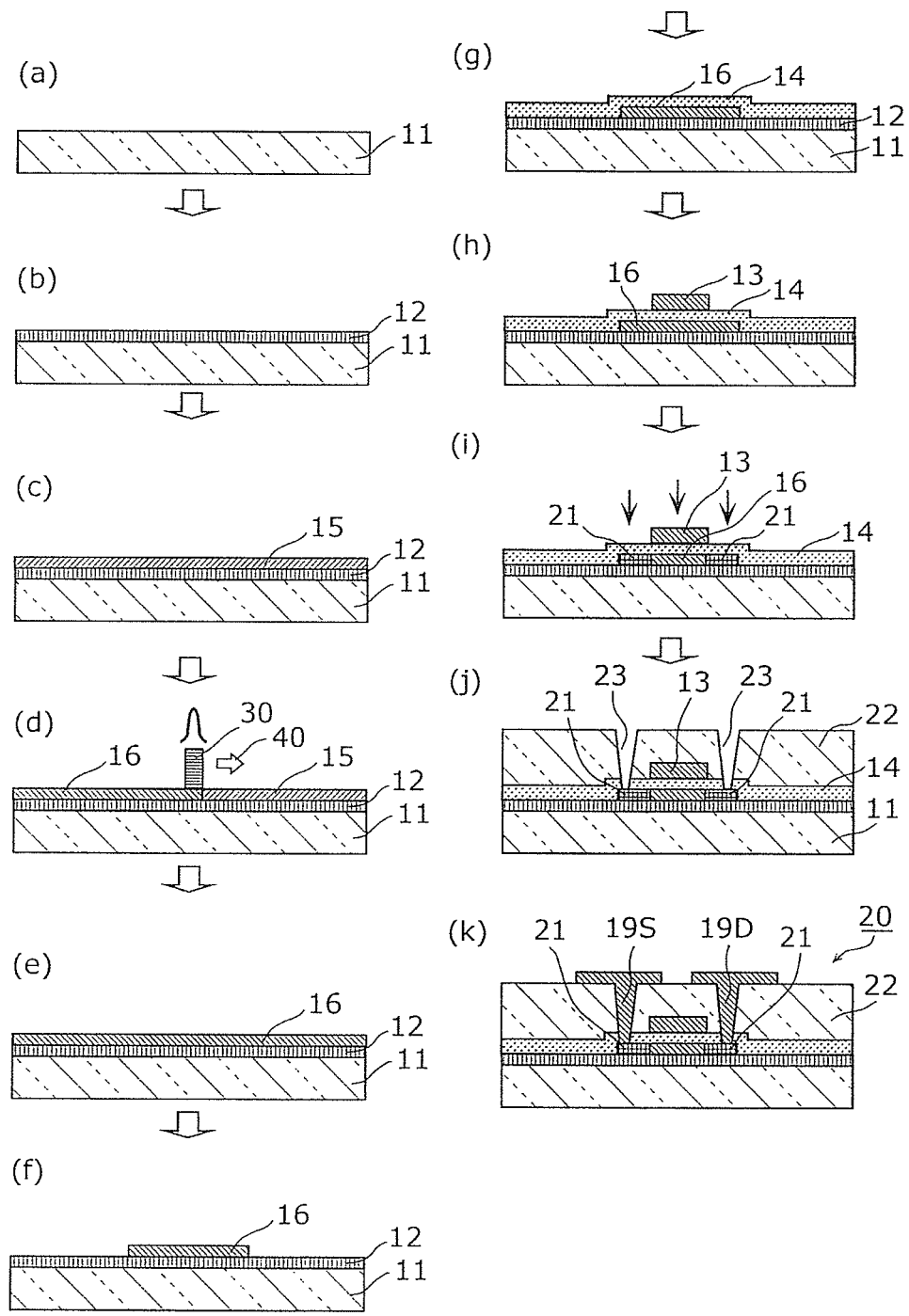
FIG. 10 (a)-(k) represents a cross-sectional view which schematically illustrates each of processes in a method for manufacturing a top-gate thin-film transistor according to the embodiment.

Described next is a method for manufacturing a top-gate thin-film transistor 20 according to the embodiment, with reference to FIG. 10. FIG. 10 represents a cross-sectional view which schematically illustrates each of processes in the method for manufacturing a top-gate thin-film transistor according to the embodiment.

First, as seen in the illustration (a) of FIG. 10, the substrate 11 is prepared and placed on a stage (not shown). The substrate 11 may be a glass substrate, for example.

Next, as seen in the illustration (b) of FIG. 10, the undercoat layer 12, which is made of an insulating film such as a silicon nitride film or a silicon oxide film, is formed above the substrate 11.

Then, as seen in the illustration (c) of FIG. 10, the non-crystalline silicon thin film 15 is formed above the undercoat layer 12. For example, an amorphous silicon thin film is formed as the non-crystalline silicon thin film 15 above the undercoat layer 12 by plasma CVD.

Next, as seen in the illustration (d) in FIG. 10, the laser beam 30 is scanned relative to the non-crystalline silicon thin film 15 in the predetermined scanning direction 40 in a manner that the non-crystalline silicon thin film 15 has a predetermined region irradiated with the laser beam 30. Hence, as seen in the illustration (e) of FIG. 10, the non-crystalline silicon thin film 15 is crystallized to be the crystalline silicon thin film 16. The process is implemented by a technique similar to the one for the laser beam emitting process included in the above-described method for manufacturing a crystalline thin film.

Next, as seen in the illustration (f) of FIG. 10, the crystalline silicon thin film 16 is patterned in an island shape by photolithography and wet etching.

Then, as seen in the illustration (g) in FIG. 10, the gate insulating film 14 is formed to cover the island-shaped crystalline silicon thin film 16. For example, above the entire surface of the substrate 11, one of a silicon oxide film and silicon nitride film, or a stacked film including thereof is formed as the gate insulating film 14 above the crystalline silicon thin film 16 and the undercoat layer 12 by plasma CVD.

Next, as seen in the illustration (h) of FIG. 10, the gate electrode 13 formed in a predetermined shape is provided above the crystalline silicon thin film 16. For example, a gate metal film is formed above the entire surface of the gate insulating film 14 by sputtering. Then, the gate metal film is patterned by photolithography and wet etching to form the gate electrode 13 provided in a predetermined shape.

Then, as seen the illustration (i) in FIG. 10, a contact region 21 is formed by doping the both end portions of the crystalline silicon thin film 16 with an impurity, using the gate electrode 13 as a mask.

Next, as seen in the illustration (j) in FIG. 10, a passivation film 22 is formed above the substrate 11. For example, the passivation film 22 made of an insulating film including silicon oxide is formed by the plasma CVD above the entire surface of the substrate 11 so as to cover the gate electrode 13 and the gate insulating film 14. After that, as seen in the illustration (j) in FIG. 10, contact holes are made on the passivation film 22 to expose a lightly-doped-drain (LDD) region 21.

Then, as seen in the illustration (k) of FIG. 10, a pair of the source electrode 19S and the drain electrode 19D is formed above the passivation film 22 so as to fill the contact holes.

This is how the top-gate thin-film transistor 20 is manufactured. After that, the entire thin-film transistor 20 may be covered by a passivation film formed of an insulating film, including silicon nitride or silicon oxide, by CVD.

The method for manufacturing the top-gate 20 according to the embodiment involves scanning using the laser beam 30 in the direction of the largest residual stress on the substrate 11 when the non-crystalline silicon thin film 15 is crystallized with the laser beam 30. Such a feature successfully curbs an increase in warpage amount of the substrate 11, and improves the flatness of the substrate 11 in substrate chuck. Hence, in the following process, the substrate 11 can be firmly fixed to the stage. The method for manufacturing the thin-film transistor 10 according to the embodiment achieves an improvement in anisotropy in amount of warpage and shrinkage of the substrate 11, and allows a predetermined exposure to be carried out in the following photolithography process.

The methods for manufacturing the crystalline thin film and the thin-film transistor in the present invention are implemented in, but not limited to, the above-described embodiment.

Examples of the predetermined laser beam employed in the embodiment include, but are not limited to, the CW laser.

Exemplary predetermined laser beams may include a YAG laser beam and a beam for heating a lamp.

The direction of the largest residual stress according to the embodiment is identified to be, but not limited to, one of the two mutually-perpendicular directions of the X-axis direction (the first direction) and the Y-axis direction (the second direction). An exemplary direction of the largest residual stress to be identified may be one of multiple directions on an X-Y plane through the X-axis.

The semiconductor thin film according to the embodiment is, but not limited to, a silicon thin film. An exemplary semiconductor thin film may be formed of germanium (Ge) or SiGe, and such a semiconductor thin film may be crystallized. Furthermore, the semiconductor thin film may be either an n-type semiconductor or a p-type semiconductor.

The laser beam according to the embodiment may be formed in a manner that the beam half width W1 is narrower than the beam long-axis width W2; instead, the beam half width W1 may be wider than the beam long-axis width W2. The latter case shall not change the scanning direction in the laser beam as seen in the embodiment, and the laser beam scans in a manner that the short axis of the laser beam matches with the scanning direction.

The emission profile (the intensity-distribution profile) of the laser beam to the silicon thin film according to the embodiment is, but not limited to, rectangle having a short axis and a long axis. Exemplary emission profiles (intensity-distribution profiles) of the laser beam to the silicon thin film may be oval including another long axis and short axis, circular, or square.

The bottom-gate thin-film transistor according to the embodiment is a channel-protecting thin-film transistor including the channel protecting film 17; instead, the bottom-gate thin-film transistor may be a channel-etching thin-film transistor without the channel protecting film 17.

The crystalline thin film (a crystalline thin film substrate) according to the embodiment is used for a thin-film transistor; instead, the crystalline thin film may be used for various electronic devices such as photoelectric converting devices for solar batteries and image sensors.

The thin-film transistor or an alley substrate for the thin-film transistor manufactured according to the embodiment may be used for display apparatuses such as organic EL display devices or liquid crystal display devices. The display apparatuses may be used as flat panel displays for electronic devices such as TV sets, personal computers, or cellular phones.

Although only an exemplary embodiment of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

A crystalline thin film according to the present invention is useful to electronic devices having crystalline silicon thin films, such as thin-film transistors, solar batteries, and sensors. Furthermore, a thin-film transistor according to the present invention may be applicable to a wide range of display apparatuses for TV sets, personal computers, or cellular phones, or of electronic appliances other than the display devices.

REFERENCE SIGNS LIST

10 and 20 Thin-film transistor
11 Substrate
12 Undercoat layer
13 Gate electrode
14 Gate insulating film
15 Non-crystalline silicon thin film
16 Crystalline silicon thin film
17 Channel protecting film
18 Contact layer
19 Source-drain metal film
19S Source electrode
19D Drain electrode
21 LDD region
22 Passivation film
30 Laser beam
40 Scanning direction

The invention claimed is:

1. A method for forming a crystalline thin film, the method comprising:
   preparing a substrate;
   forming a thin film above the substrate; and
   crystallizing at least a predetermined region in the thin film, by irradiating the thin film with a beam having a predetermined wavelength and scanned relative to the substrate,
   wherein if (i) the substrate has an end portion intersecting with a first direction and an other end portion intersecting with a second direction which runs perpendicular to the first direction and (ii) the end portion and the other end portion warp toward a light source of the beam, a warpage amount of the end portion is compared with a warpage amount of the other end portion and one of the first direction and the second direction, whichever having a larger warpage amount of the warpage amounts, is identified as a direction of a largest residual stress on the substrate, and
   in the crystallizing, the beam is scanned in the identified direction of the largest residual stress.

2. The method for forming the crystalline thin film according to claim 1,
   wherein the beam is one of a YAG laser beam, a continuously oscillated laser beam, and a beam for heating a lamp.

3. The method for forming the crystalline thin film according to claim 1,
   wherein the irradiating includes irradiating a whole surface of the thin film with the beam.

4. The method for forming the crystalline thin film according to claim 1,
   wherein the substrate is rectangular, and
   the direction of the largest residual stress is a longitudinal direction of the substrate.

5. The method for forming the crystalline thin film according to claim 1,
   wherein the substrate is a glass substrate.

6. The method for forming the crystalline thin film according to claim 1,
   wherein the substrate is a plastic substrate.

7. A method for manufacturing a thin-film transistor including forming a channel region of a bottom-gate thin-film transistor, using the method for forming the crystalline thin film according to claim 1.

8. The method for forming the crystalline thin film according to claim 1,
   wherein the substrate is manufactured by thermally processing a precursor of the substrate.

9. The method for forming the crystalline thin film according to claim 8,
   wherein the substrate formed by stretching and cooling the precursor of the substrate, and
   the direction of the largest residual stress is a direction in which the substrate is stretched.

\* \* \* \* \*